United States Patent
Tanaka et al.

(10) Patent No.: US 8,001,065 B2
(45) Date of Patent: Aug. 16, 2011

(54) SEMICONDUCTOR STORAGE DEVICE

(75) Inventors: Chika Tanaka, Yokohama (JP);
Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 563 days.

(21) Appl. No.: 12/211,739

(22) Filed: Sep. 16, 2008

(65) Prior Publication Data
US 2009/0083202 A1 Mar. 26, 2009

(30) Foreign Application Priority Data
Sep. 26, 2007 (JP) ................... 2007-249653

(51) Int. Cl.
*G06N 5/00* (2006.01)
(52) U.S. Cl. .......................... 706/15; 706/45
(58) Field of Classification Search .............. 706/15, 706/45
See application file for complete search history.

(56) References Cited

U.S. PATENT DOCUMENTS

| | | | | |
|---|---|---|---|---|
| 5,055,897 A | * | 10/1991 | Canepa et al. | 257/319 |
| 5,237,210 A | * | 8/1993 | Castro | 706/35 |
| 5,256,911 A | * | 10/1993 | Holler et al. | 706/37 |
| 5,818,081 A | * | 10/1998 | Ohmi et al. | 257/319 |

OTHER PUBLICATIONS

Ouyo Butsuri, Tadashi Shibata, "*Psychologically-inspired VLSI Brain Model—New Processor Architecture Inspired by Biological Principal*", Jpn. J. Appl. Phys., vol. 72, No. 10, 2003, pp. 1268-1275.
R.E. Howard, et al., "*An Associative Memory Based on an Electronic Neural Network Architecture*", IEEE Transactions on Electron Devices, vol. ED-34, No. 7, Jul. 1987, pp. 1553-1556.

* cited by examiner

*Primary Examiner* — Wilbert L Starks
(74) *Attorney, Agent, or Firm* — Ohlandt, Greeley, Ruggiero & Perle, L.L.P.

(57) ABSTRACT

A semiconductor storage device includes a storage part including a plurality of nonvolatile semiconductor memory cells each having a conductive path, a charge storage layer and a control gate electrode. The device further includes a plurality of first input terminals each connected to one end of the conductive path of each nonvolatile semiconductor memory cell, a plurality of second input terminals each connected to the control gate of each nonvolatile semiconductor memory cell, and an output end connected to the other ends of the conductive paths of the plurality of nonvolatile semiconductor memory cells, respectively.

19 Claims, 6 Drawing Sheets

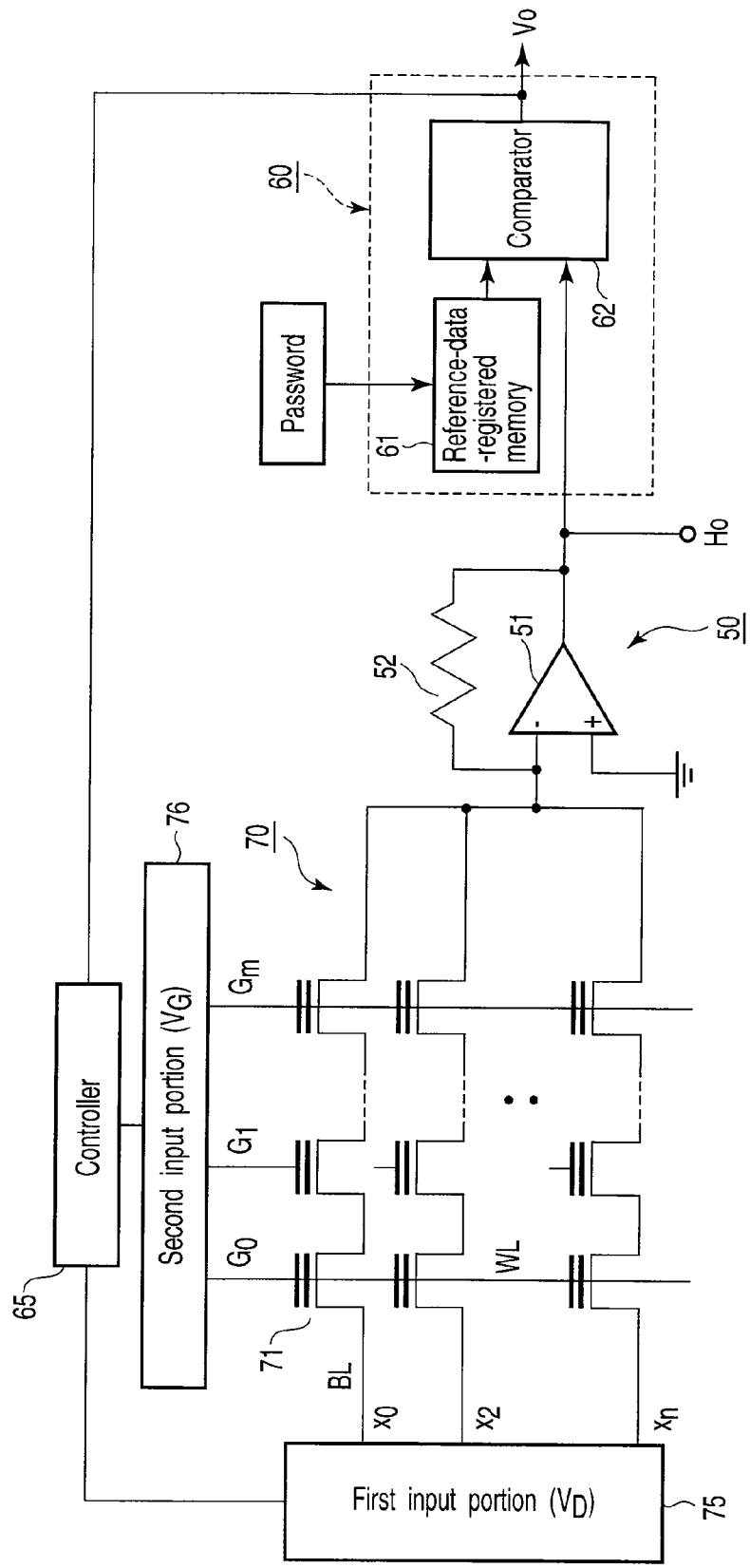
F I G. 8

SEMICONDUCTOR STORAGE DEVICE

CROSS-REFERENCE TO RELATED APPLICATIONS

This application is based upon and claims the benefit of priority from prior Japanese Patent Application No. 2007-249653, filed Sep. 26, 2007, the entire contents of which are incorporated herein by reference.

BACKGROUND OF THE INVENTION

1. Field of the Invention

The present invention relates to a semiconductor storage device for use in personal authentication or the like. More particularly, it relates to a semiconductor storage device to which an engineering neuron model is applied.

2. Description of the Related Art

In recent years, security devices concerning personal information, for example, an IC card and a fingerprint authentication device for biometric authentication have increased. In the IC card having a security function, there are various approaches concerning technologies for encrypting an input signal or preventing the theft of data. For example, as to the encryption, sophisticated encryption algorithms such as RSA and elliptic function can be used to improve reliability. However, from the viewpoint of power reduction, it is not realistic to mount these complicated algorithms on miniaturized devices.

As an encryption technology for the reduction of power consumption, a device using a neuron model has been investigated. In the device in which the neuron model is used, registered data are subjected to weighted coupling (encrypted). In this kind of device, reverse reading is more difficult than in a case of simple conversion into electrical signals, and hence the device has the function of data theft prevention.

As the devices in which the neuron model is used, a neuron MOS (e.g., see Tadashi Shibata, Jpn. J. App. Phys., Vol. 72, No. 10, [2003]) and a circuit including a resistor and an inverter (e.g., see R. E. Howard, et al., ED, 34, 1553 (1987)) have heretofore been suggested. However, the device referred to as the neuron MOS has a structure in which several floating gates are formed under a single gate, so that it is difficult to directly control the charge state of each floating gate. In the circuit including the resistor and the inverter, a large resistance change is required, which increases the power consumption. Furthermore, in these structures, there is a problem that a coupling weight can be updated, but cannot be stored or held.

Therefore, the miniaturization of the security device is intended, and a semiconductor storage device is demanded in which the coupling weight of the neuron model can be stored.

BRIEF SUMMARY OF THE INVENTION

According to one aspect of the invention, there is provided a semiconductor storage device, which includes:
a storage part including a plurality of nonvolatile semiconductor memory cells each having a conductive path, a charge storage layer and a control gate electrode;
a plurality of first input terminals connected to one end of the conductive path of each nonvolatile semiconductor memory cell;
a plurality of second input terminals each connected to the control gate of each nonvolatile semiconductor memory cell; and
an output end connected to the other ends of the conductive paths of the nonvolatile semiconductor memory cells, respectively.

BRIEF DESCRIPTION OF THE SEVERAL VIEWS OF THE DRAWING

FIG. 8 is a diagram showing the circuit constitution of a semiconductor storage device according to a third embodiment.

DETAILED DESCRIPTION OF THE INVENTION

According to the following embodiments, the characteristic coupling weight of an engineering neuron model is optimized and stored by a nonvolatile semiconductor memory cell, whereby a security device can be miniaturized, and the coupling weight of the neuron model can be stored in the device.

Prior to the description of the embodiments, the basic principle of the present invention will be described. A neural network including multiple-input/output is basically a nervous system typified by brain which is artificially prepared. The basic structure of a neuron is constituted of a main body portion referred to as a cell, a large number of portions referred to as dendrites which arborescently protrude from the main body, and one long fiber portion referred to as an axon. The neuron model is a model which imitates the neuron as shown in, for example, FIG. 1.

Here, the cell is an information processing element, and each of dendrites provided on the surface of the cell is connected to the axon of each of other cells via a coupling portion referred to as a synapse. That is, a plurality of input signals enter portions of the cell. The axon of the cell itself emits one output, and this output becomes an input signal of the cell itself or the other cell to form a network.

More specifically, in the cell, the sum of the products of inputs xi and coupling weights $w_i$ is calculated as follows:

$$s = \Sigma w_i x_i$$

Then, $y = f(s-\theta)$ is output from the axon, in which $\theta$ is a threshold.

A plurality of such information processing elements which conduct multiple-input/output can be connected to one another to constitute a neural network. Moreover, the portions of the cell execute outputs in the form of a sigmoid function with respect to the input signals. In brief, the portions of the cell execute outputs in response to input signals each having a certain threshold θ level or more, and they do not execute the outputs for any input signals below the level. This is a nonlinear behavior, which is another large feature of the neuron model. Therefore, it is also essential that the information processing element takes the nonlinear behavior (nonlinear processing) with respect to the input signals.

Figure 2:
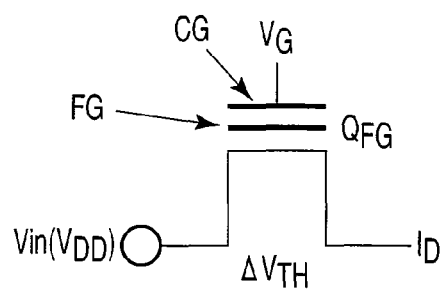
FIG. 2 is a diagram showing the constitution of a nonvolatile semiconductor memory cell for use in the embodiment of the present invention.

FIG. 2 is a diagram showing a nonvolatile semiconductor memory cell for use in the embodiment of the present invention. The basic constitution of the cell is the same as that of a nonvolatile memory cell of a general double-layer gate constitution having a floating gate (FG) and a control gate (CG). In the drawing, symbol $V_G$ is a voltage to be applied to the control gate CG, $V_{in}$ is an input voltage, $I_D$ is an output current, and $Q_{FD}$ is a charge accumulated in the floating gate FG. However, the nonvolatile semiconductor memory cell for use in the present invention is different from the general nonvolatile memory cell in a way to change a threshold.

Figure 3:
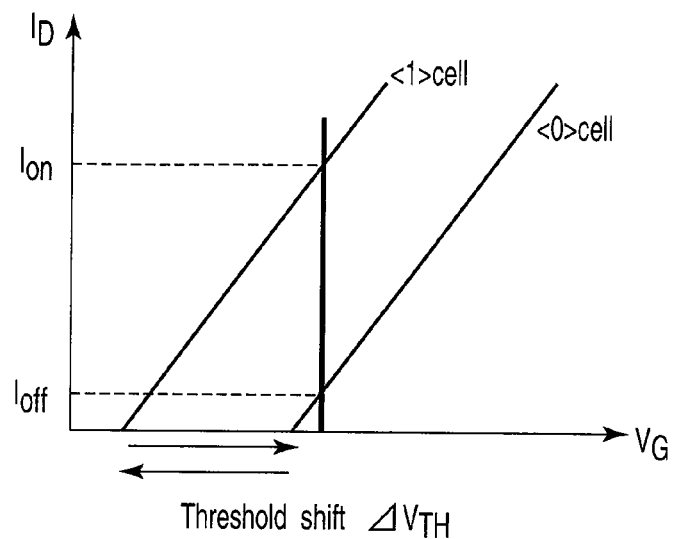
FIG. 3 is a diagram showing the threshold characteristics of a general nonvolatile semiconductor memory cell.

In the general nonvolatile memory cell, as shown in FIG. 3, when a threshold $V_{TH}$ is largely changed, an output current $I_D$ turns on ($I_{on}$) or turns off ($I_{off}$) with respect to a threshold shift $\Delta V_{TH}$. That is, the cell has a threshold distribution including two values "0" and "1", so that it is determined during reading whether the current flows ($I_{on}$) or does not flow ($I_{off}$).

Figure 4:
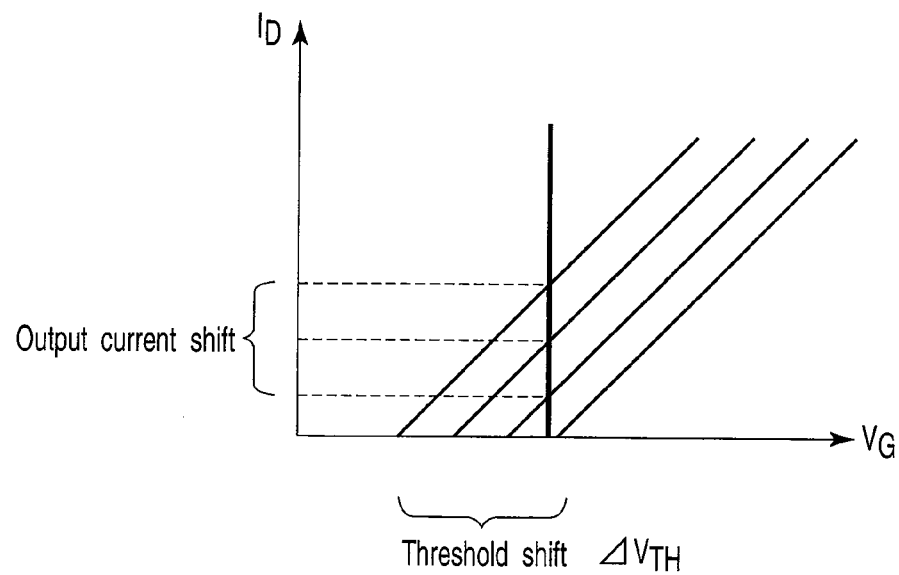
FIG. 4 is a diagram showing the threshold characteristics of the nonvolatile semiconductor memory cell for use in the embodiment of the present invention.

On the other hand, in the nonvolatile semiconductor memory cell for use in the present invention, as shown in FIG. 4, a threshold shift amount is decreased, and an output current gradually changes in accordance with the threshold shift $\Delta V_{TH}$. In this case, the threshold voltage is continuously distributed owing to the shift of the charge accumulated in the floating gate FG, and the size of the output $I_D$ with respect to the input $V_{in}$ varies in accordance with the threshold. Therefore, the threshold $V_{TH}$ of the memory cell can be regarded as the coupling weight of the neuron model.

A capacity between the floating gate (FG) and the control gate (CG) is assumed as C. From the viewpoint of the threshold shift ($\Delta V_{TH}$), the charge ($Q_{FG}$) accumulated in the floating gate FG is as follows:

$$Q_{FG} = C\Delta V_{TH}$$

Figure 1:
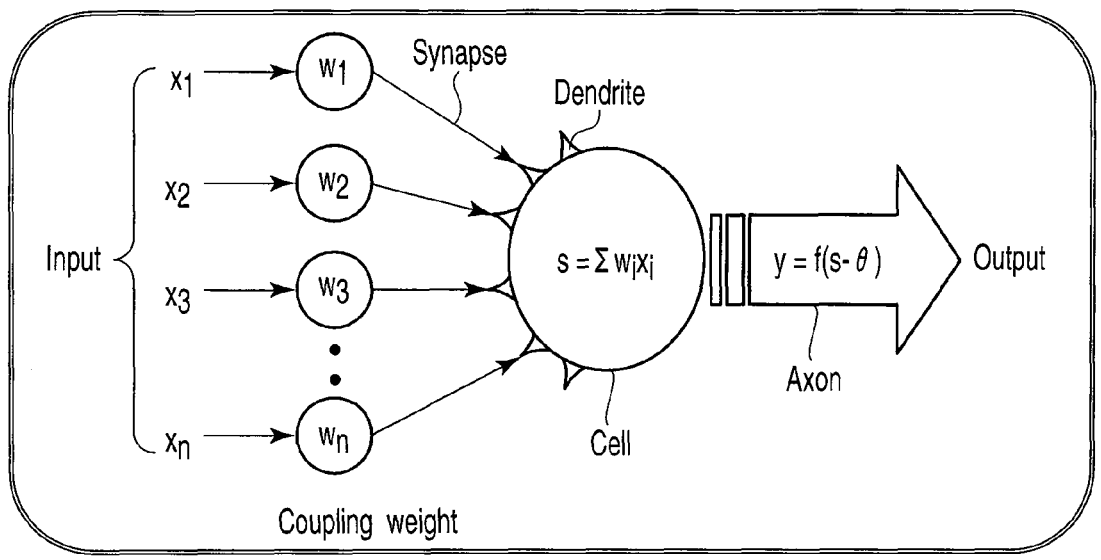
FIG. 1 is a diagram schematically showing a single neuron model.

Therefore, the charge $Q_{FG}$ can also be regarded as a coupling weight w in the neuron model of FIG. 1. The charge $Q_{FG}$ depends on the input voltage $V_{in}$ ($V_{DD}$), and can be controlled by a voltage Vg to be applied to the control gate CG during writing. Accordingly, in the present embodiment, the coupling weight can be updated and stored. Here, when the input (x) is regarded as a drain voltage ($V_{DD}=V_{in}$), as shown in FIG. 4, the drain current $I_D$ becomes a value corresponding to the threshold shift $\Delta V_{TH}$. Therefore, the product of the input and the coupling weight in the neuron model can be regarded as the shift ($\Delta I_D$) of the drain current.

When the above-mentioned nonvolatile semiconductor memory cells are arranged in parallel and the sum of the drain current shifts ($\Delta I_D$) is employed, the sum s of the products of the inputs and the coupling weights in the neuron model can be obtained, whereby the neuron model can be constituted as shown in FIG. 1.

According to the embodiments of the present invention described hereinafter, the optimization and storage of the coupling weight characterized by the engineering neuron model are performed by the nonvolatile semiconductor memory cell, whereby a security device can be miniaturized, and the coupling weight of the neuron model can be stored. The present invention will hereinafter be described in detail in accordance with the embodiments.

First Embodiment

Figure 5:
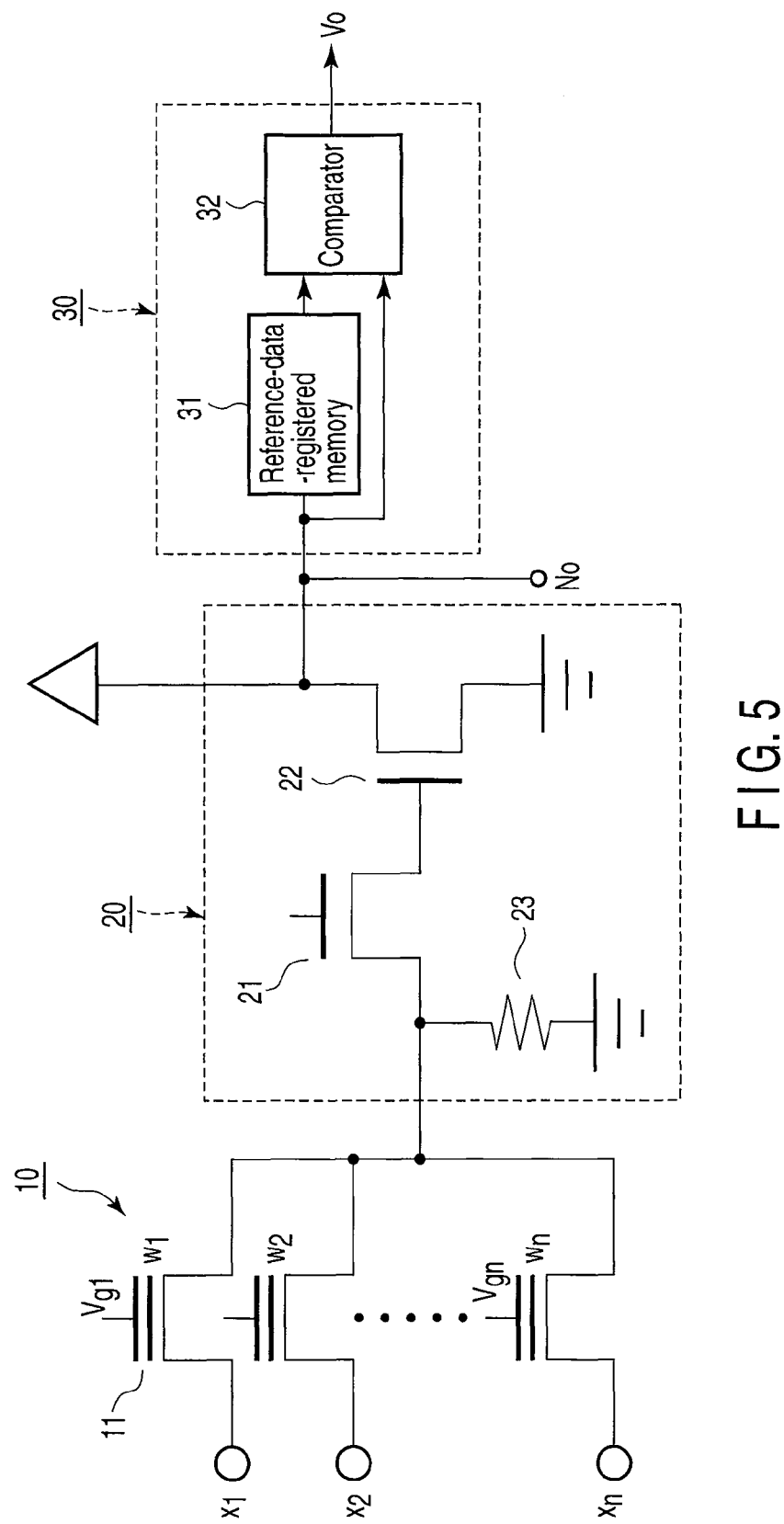
FIG. 5 is a diagram showing the circuit constitution of a semiconductor storage device according to a first embodiment.

FIG. 5 is a schematic diagram showing a semiconductor storage device having a security function according to a first embodiment of the present invention.

In the embodiment, n nonvolatile semiconductor memory cells 11 as shown in FIG. 2 are arranged in parallel to constitute a storage part 10. The gates of the memory cells 11 are connected to key input terminals, respectively, and cipher keys Vg ($V_{g1}$ to $V_{gn}$) can be input into the key input terminals. The sources of the memory cells 11 are connected to data input terminals, respectively, and data x ($x_1$ to $x_n$) can be input into the data input terminals, respectively. Here, an example will be described in accordance with image data such as a fingerprint. The drains of the memory cells 11 are connected in common to an addition/nonlinear processing part 20.

The addition/nonlinear processing part 20 is constituted of a selection transistor 21, an output transistor 22, a resistor 23 and the like. The drains of the memory cells 11 of the storage part 10 are connected in common to the source of the selection transistor 21 to add the drain outputs of the memory cells 11 thereto. The drain of the selection transistor 21 is connected to the gate of the output transistor 22. When the selection transistor 21 is turned on, the sum of the drain outputs of the memory cells 11 is applied to the gate of the output transistor 22. The data (authentication data) to which the drain outputs of the memory cells 11 are added are output from the drain of the output transistor 22 to an identification part 30. It is to be noted that the threshold of the output transistor 22 corresponds to a threshold θ in the neuron model shown in FIG. 1.

The identification part 30 is constituted of a reference-data-registered memory 31 for registering reference data corresponding to identification data, and a comparator 32 which compares the identification data from the addition/nonlinear processing part 20 with the reference data of the memory 31 to identify the data. When the reference data are registered, the identification data as the output signals of the addition/nonlinear processing part 20 are supplied to the registered memory 31, and the identification data are registered as the reference data in the registered memory 31.

On the other hand, during the identification of authentication data, the authentication data as the output signals of the addition/nonlinear processing part 20 are input into the comparator 32, whereby the authentication data are compared with the reference data of the memory 31 to identify the data.

It is to be noted that the storage part 10, the addition/nonlinear processing part 20 and the identification part 30 are provided on the same chip, and mounted on an authentication card or the like. Then, a user inserts this authentication card into the terminal of an authentication device provided with a CCD imaging device and the like, to input the image data of the fingerprint and the like into the input terminal, thereby performing the authentication.

As shown in FIG. 5, in a case where a large number of nonvolatile semiconductor memory cells 11 are connected in parallel, a voltage Vg changes the coupling weight with respect to a drain voltage $V_{DD}$ of each memory cell 11, whereby a coupling weight can be stored and updated. When the selection transistor 21 is turned on, the sum of the drain currents from the memory cells 11 can be taken as an output.

In the present embodiment, the nonvolatile semiconductor memory cell is used, so that a conventional process can be utilized. Moreover, robust properties concerning output characteristics or the like peculiar to the neuron model can protect the nonvolatile semiconductor memory cell from severe situations, even if scaling advances and the fluctuations of various characteristics of the devices increase.

It is to be noted that FIG. 5 shows only the basic system of the storage device according to the present invention. The outputs of a plurality of input signals X1 to An in a terminal No are one-bit signals of "0" or "1", and the reference data also become the one-bit signals.

In actual application, a plurality of circuits shown in FIG. 5 are arranged in parallel, and the one bit of the reference data is registered in each registered memory 31, whereby the present invention can be applied as a whole to the identification of more complicated reference data. In a case where the input signal is a two-dimensional image, and, for example, n-line data are input for each line, n-bit data as output signals are output. In this case, the reference data may be of n bits.

Moreover, when the output terminal No is connected to the input terminal of another circuit, a multistage network can be constituted, and the output of such a multistage network can be connected to the identification part 30.

Next, a specific example of an authenticating operation using the present embodiment will be described. Here, a fingerprint is registered with a cipher key, and a user is identified or not by the authentication of the fingerprint.

To register the reference data, first the user sets the cipher key to input this key into a key input terminal. In consequence, a voltage (write voltage) corresponding to the cipher key is applied to the control gate of the memory cell 11 of the storage part 10. During this writing, coupling weights w ($w_1$ to $w_n$) are set in the memory cells 11.

On the other hand, image data obtained by picking up the image of the fingerprint with a CCD imaging device or the like are input into data input terminals ($x_1$ to $x_n$). At this time, a usual read voltage lower than the write voltage is applied to the control gate. In consequence, the respective memory cells 11 output drain currents ID uniquely derived in accordance with the product of the input data x and the coupling weights w in the neuron model, that is, a drain voltage Vin and a threshold shift ($\Delta V_{TH}$). These currents are added thereto by the addition/nonlinear processing part 20, and output as authentication data. Then, the data are stored as the reference data in the memory 31 of the identification part 30.

To identify the authentication data, the usual read voltage lower than the write voltage is applied to the control gate of each memory cell 11. When the image data of the fingerprint and the like are input into the data input terminal, the respective memory cells 11 in the neuron model output the drain currents $I_D$ uniquely derived in accordance with the product of the input and the coupling weight, that is, the drain voltage Vin and the threshold shift ($\Delta V_{TH}$). Then, these currents are added thereto and subjected to nonlinear processing by the addition/nonlinear processing part 20, and output as the authentication data. This authentication data are compared with the reference data registered in the memory 31 to identify the data by the identification part 30. Then, when a difference between these data is an allowable value or less, the identification is regarded as successful. When the difference is other than the allowable value, it is determined that the identification has failed. That is, the user can be identified or not.

Even if the image data of the fingerprint, face and the like belong to the same person, the data sometimes slightly change owing to various factors. When the data are excessively strictly evaluated, the user sometimes cannot be identified. In this case, the user inputs the cipher key. Then, the storage part 10 cooperates with a controller (not shown) to gradually change the write voltage corresponding to the cipher key and slightly change the coupling weight in the respective memory cells 11. Moreover, the authentication data are identified again. In consequence, the same person can be identified as the user even in a state in which the image data partially change from the reference data. Needless to say, the shift amount of the write voltage can be set to an arbitrary amount, and a predetermined value is set to an upper limit.

Moreover, when the user is identified by the above operation, the reference data to be stored in the memory 31 of the storage part 10 may be rewritten using the above controller based on the coupling weight and the image data of the memory cell 11 originally input with the cipher key. In consequence, the reference data come close to the present user's image data, and the subsequent identification can quickly be performed.

Furthermore, the reference data to be stored in the memory 31 can be rewritten, and hence even user's change can be handled. That is, when the user's change occurs, the cipher key may be input again, and new image data may be input to rewrite the reference data to be stored in the memory 31 of the storage part 10.

As described above, according to the present embodiment, there are provided the storage part 10 including the nonvolatile semiconductor memory cells 11, the addition/nonlinear processing part 20 which adds thereto the drain outputs of the memory cells 11 of the storage part 10 and which performs nonlinear processing, and the identification part 30 which inputs, as the authentication data, the signals output from the addition/nonlinear processing part 20 to compare the data with the reference data and identify the data, whereby personal authentication with the fingerprint or the like can be realized.

In this case, the security device of the neuron model can be realized using the nonvolatile semiconductor memory cell 11, and the security device can be miniaturized. In addition, the threshold of the memory cell 11 can be changed to easily change the coupling weight of the neuron model.

Second Embodiment

Figure 6:
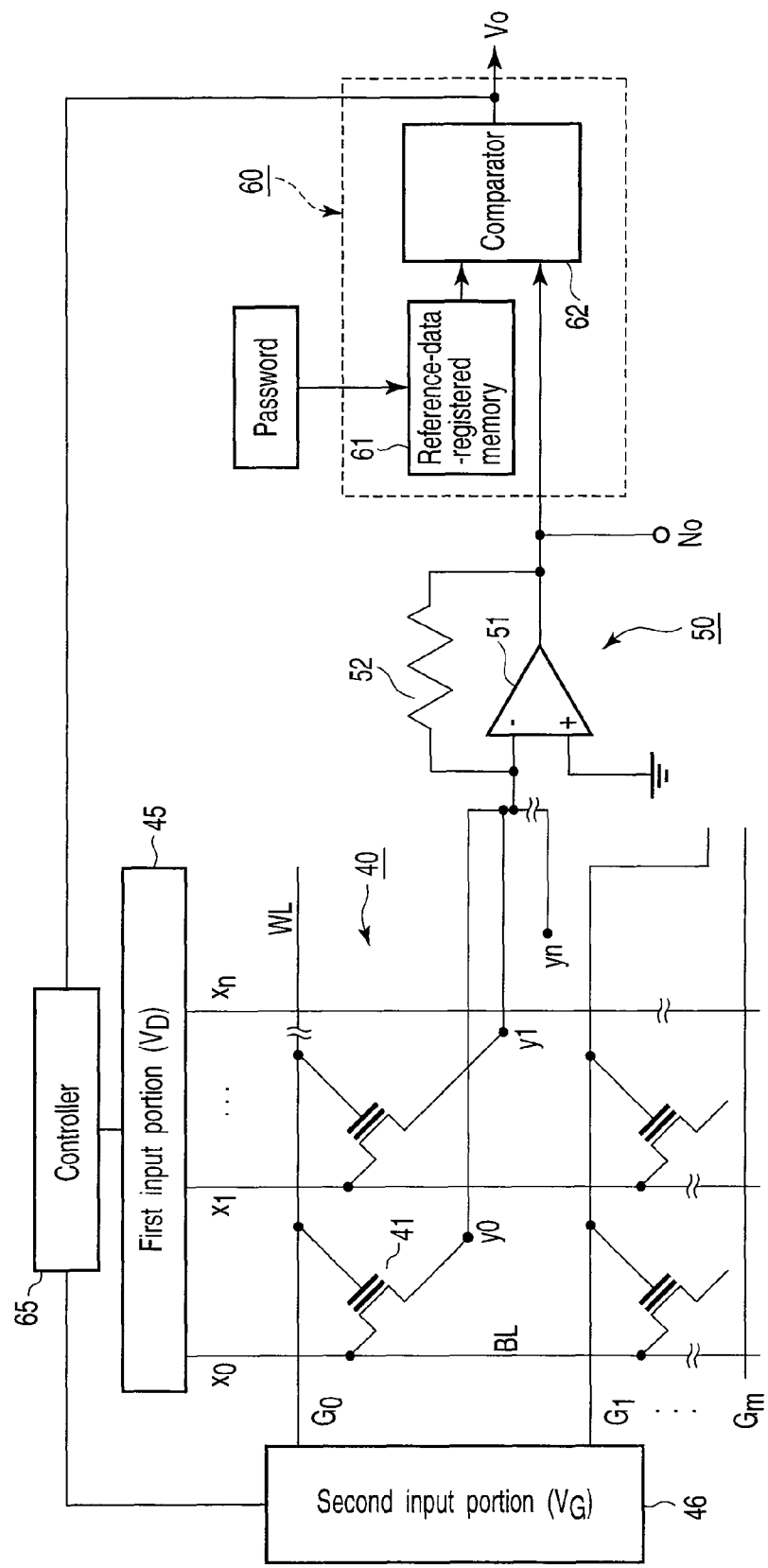
FIG. 6 is a diagram showing the circuit constitution of a semiconductor storage device according to a second embodiment.

FIG. 6 is a circuit diagram showing a semiconductor storage device having a security function according to a second embodiment of the present invention.

In a storage part 40, bit lines BL into which data $x_i$ are input from the input ends of a first input portion and word lines WL into which random numbers Gi are input as cipher keys from the input ends of a second input portion are arranged so that the lines cross each other. Nonvolatile semiconductor memory cells 41 are arranged in the intersecting portions of these lines, respectively. The source of each memory cell 41 is connected to the bit line BL of the corresponding intersecting portion, and the control gate is connected to the word line WL of the corresponding intersecting portion. The memory cell 41 has a floating gate (FG) and a control gate (CG) as shown in FIG. 2, and the coupling weight of a neuron model is stored in the cell in accordance with the amount of a charge to be accumulated in the floating gate.

Each of the word lines WL is provided with an addition/nonlinear processing part 50, and the output ends connected to the drains of a plurality of memory cells 41 connected to the same word line WL are connected in common to the input end of the addition/nonlinear processing part 50. The addition/nonlinear processing part 50 is constituted of an operational amplifier 51, a return resistor 52 and the like, and authentication data as the output signals of the addition/nonlinear processing part 50 can be identified by an identification part 60.

The identification part 60 is constituted of a reference-data-registered memory 61 for registering reference data, and a comparator 62 which compares the authentication data from the addition/nonlinear processing part 50 with the data (reference data) stored in the memory 61 to identify the data. During the registration of the reference data, there are registered, as the reference data, data corresponding to one bit of a password or a serial number such as an employee number input by a user. On the other hand, during the identification of the authentication data, the output signal of the addition/nonlinear processing part 50 is input into the comparator 62, whereby the authentication data as the output signals of the addition/nonlinear processing part 50 can be compared with the reference data of the memory 61 to identify the data. The identification result is output as an output signal Vo, but the identification result is fed back to the second input portion through a controller 65.

It is to be noted that FIG. 6 shows the addition/nonlinear processing part 50 and the identification part 60 only for one line ($G_0$) of the word line, but in actual, each of the word lines WL (G0 to Gn) is provided with these parts. Moreover, the storage part 40, the addition/nonlinear processing part 50 and the identification part 60 are provided on the same chip and mounted on an authentication card or the like in the same manner as in the first embodiment described above. Then, the user inserts this authentication card into the terminal of the authentication device provided with a CCD imaging device and the like, and is subjected to authentication.

Figure 7:
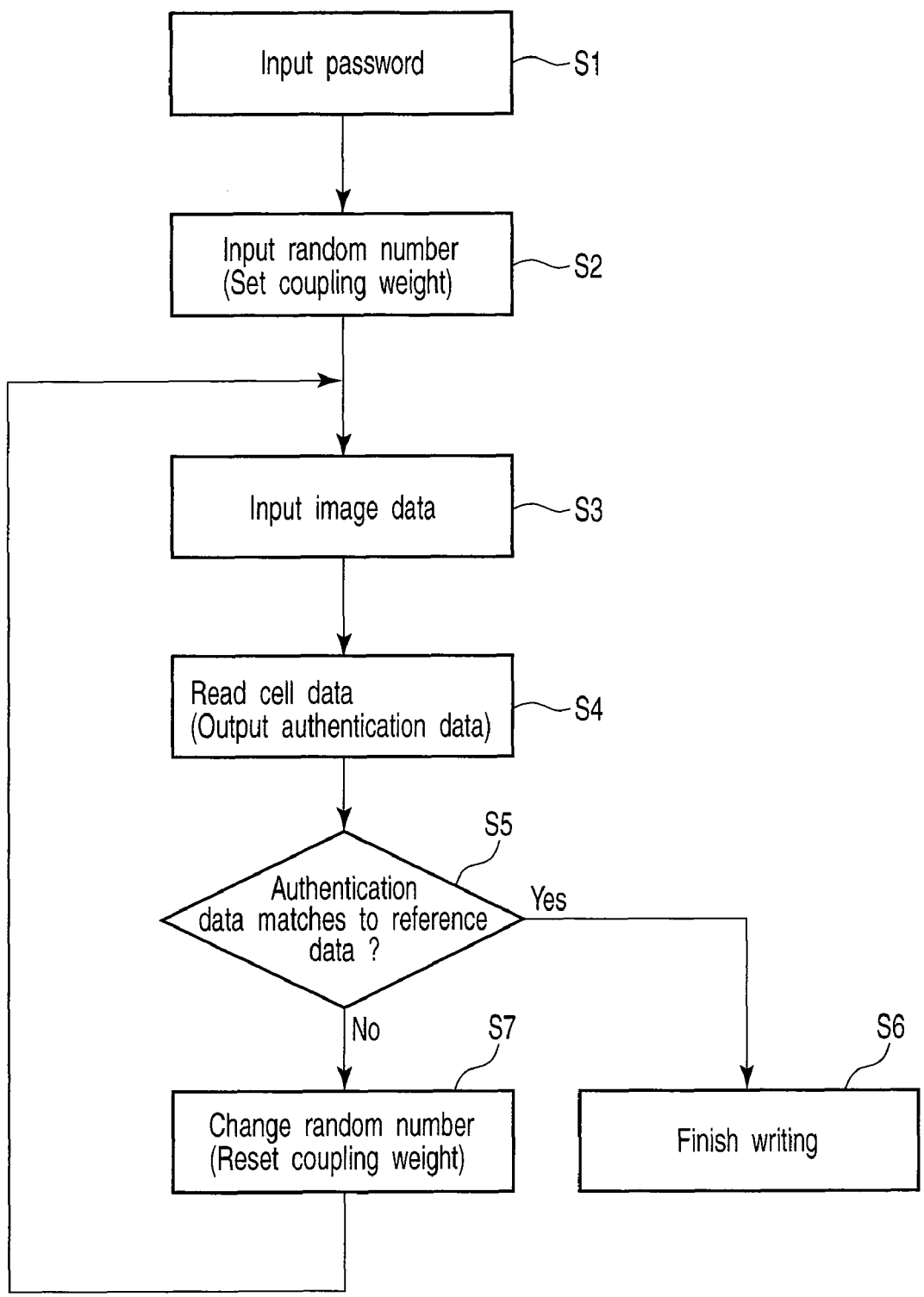
FIG. 7 is a flow chart showing a write mechanism in the semiconductor storage device according to the second embodiment.

FIG. 7 is a diagram showing the write mechanism of the reference data in the present embodiment. It is to be noted that to simplify the description, the mechanism concerning one line will hereinafter be described.

First, for example, the employee number is input as the password or a user ID into the identification part 60 (step S1). In consequence, the reference data corresponding to the employee number are registered in the memory 61 of the identification part 60. Here, the identification part 60 is provided for each word line, so that the n-bit employee number is allocated and registered in the memories 61 of n identification parts 60.

It is to be noted that when the memory 61 is constituted of a nonvolatile memory having a floating gate, the password may be input once. Conversely, when the memory 61 is constituted of a volatile memory such as a DRAM, the input of the password is required for each authentication, and further improvement of security can be achieved.

On the other hand, for example, an appropriate random number is supplied as an initial value $G_i$ to the word line WL to set the coupling weight of the memory cell 41 (step S2). That is, a write voltage corresponding to the value Gi (i=0 to n) is applied to the control gate of the memory cell 41, and a charge is injected into the floating gate of the memory cell 41 to change the threshold of the memory cell 41.

Subsequently, the image data of a facial image and the like obtained by the imaging device of an authentication terminal are input into the bit line BL (step S3). In a case where the image data are two-dimensional images, the image data for each line may be successively input.

Subsequently, a usual read voltage lower than a write voltage is applied to the control gate of the memory cell 41 to read the output of the memory cell 41. Moreover, the output of the memory cell 41 connected to the same word line is added thereto by the addition/nonlinear processing part 50 to obtain the authentication data (step S4).

Subsequently, the authentication data obtained by the addition/nonlinear processing part 50 are identified by the identification part 60 (step S5). That is, the authentication data obtained from the addition/nonlinear processing part 50 are compared with the reference data stored in the memory 61 to identify the data by the comparator 62.

Here, when there is no difference between the authentication data and the reference data or when the difference is an allowable value or less (when the difference converges to zero), the writing is finished (step S6).

When the difference between the authentication data and the reference data cannot be ignored (when the difference does not converge to zero), the random number Gi is changed to change the coupling weight of each memory cell 41 (step S7).

To change the coupling weight, specifically, for example, the following operation is performed. First, the potentials of an input terminal xn and an output terminal yn of the memory cell 41 are floated. Furthermore, the control gate is brought to a 0V state, and an erasable voltage is applied to a substrate potential. In consequence, a charge written to the floating gate is erased. At this time, the charge is not completely erased, and the applied state of the erasable voltage is controlled so that the demanded amount of the charge remains in the floating gate.

Subsequently, while the output terminal yn remains in a floating state, the data are input into the input terminal xn, and the write voltage is applied to the control gate. At this time, the charge to be written to the floating gate varies in accordance with the signal input into the terminal xn. That is, when the terminal xn has the 0V state, electrons are injected into the floating gate, and the threshold changes. However, when the terminal has a floating state, no charge is written to the floating gate, and there is no change of threshold.

Thus, the coupling weight of the activated memory cell further increases in accordance with the input data, and the coupling weight can be reset so that the coupling weight of the inactive memory cell becomes weaker. Then, the coupling weight is changed, the image is input again in the step S3, and the data are read in the step S4. At this time, to input the image data, the data of the firstly picked image stored in a buffer memory or the like can be used as it is.

Furthermore, in the step S5, the authentication data obtained by the addition/nonlinear processing part 50 are identified again by the identification part 60. Then, the above operation is repeated until the difference between the authentication data and the reference data as an output error becomes the allowable value or less.

Moreover, the above operation is performed for each line, and the coupling weights of the memory cells 41 in all the lines are initialized, changed and finally set. In consequence, the coupling weight of the memory cell 41 can be set so that the authentication data obtained by the addition/nonlinear processing part 50 substantially match to the reference data input as the password into the identification part 60.

To read and obtain the authentication data, the read voltage is applied to each memory cell 11 to such an extent that no input data is written. At this time, the authentication data obtained by the addition/nonlinear processing part 50 are compared with the reference data stored in the memory 61 to identify the data by the comparator 62 of the identification part 60. Furthermore, this comparison identifying operation is successively performed for each line. Then, when the difference between these data is the allowable value or less in all the lines, the identification is regarded as successful. When the difference is other than the allowable value even in one line, it is determined that the identification has failed. That is, it can be evaluated whether or not the user is identified.

Moreover, the reference data may appropriately be updated during the data authentication. That is, when the difference between the authentication data and the reference data is not large, an operation of writing new reference data may be performed. More specifically, the coupling weight of the memory cell 41 is reset so that the difference between the authentication data and the reference data further decreases in the identification part 60.

Thus, according to the present embodiment, the password or a user ID is input into the identification part 60. Moreover, the coupling weight of the memory cell 41 is preset, and the coupling weight of the memory cell 41 is set so that the authentication data obtained by the input of the image data of the user match to the reference data corresponding to the password or the user ID. In consequence, when the facial image or the like is picked up by the authentication terminal, the user can obtain authentication. Therefore, an effect similar to that of the above first embodiment can be obtained. There is another advantage that when an individual identification number such as the employee number is input as the password or the user ID, the user using the terminal can be specified on a terminal side.

Third Embodiment

FIG. 8 is a circuit diagram showing a semiconductor device having a security function according to a third embodiment of the present invention. It is to be noted that the same part as that of FIG. 6 is denoted with the same reference numbers, and detailed description thereof is omitted.

A storage part 70 of the present embodiment is constituted by arranging, in parallel, serially connected units in which a plurality of nonvolatile semiconductor memory cells 71 are connected in series. Each memory cell 71 has a floating gate (FG) and a control gate (CG) as shown in FIG. 2, and the coupling weight of a neuron model is stored in accordance with the amount of a charge to be accumulated in the floating gate.

The source lines of the respective serially connected units on one end side are connected to bit lines BL having input ends coupled to a first input portion 75, and the control gates of the memory cells 71 are connected to word lines WL having input ends coupled to a second input portion 76. That is, the control gate of the i-th (i=0 to m) memory cell of each of the serially connected units is connected to the i-th word line WL (Gi) for use in inputting a cipher key. The drain lines of the serially connected units on the other end side are connected in common to the reverse input end of an addition/nonlinear processing part 50. Then, the output of the addition/nonlinear processing part 50 is compared with reference data in an identification part 60.

It is to be noted that in the present embodiment, the addition/nonlinear processing part 50 and the identification part 60 are not provided for each word line, and are provided for all the word lines. Therefore, the data corresponding to the word lines are registered in a memory 61 of the identification part 60, respectively, and the reference data corresponding to the word line as a comparison target is read for comparison reference by a comparator 62.

The present embodiment is different from the second embodiment in that the storage part 70 has a NAND array structure, but the writing, reading and update mechanisms of the present embodiment are substantially similar to those of the second embodiment. That is, the outputs of the memory cells 71 connected to the same word line are added up to obtain authentication data. Then, the identification part 60 compare the authentication data with reference data to identify the data for each word line. Moreover, the changing of the coupling weight in the memory cell 71 may be performed in the same manner as in the usual writing to a NAND cell, and reading may be performed in the same manner as in the usual NAND cell.

Even in the third embodiment, a method for writing the reference data as described in the second embodiment with reference to FIG. 7 can be applied. Therefore, an advantage similar to that of the second embodiment described above is obtained. In addition, in the present embodiment, only one set of the addition/nonlinear processing part 50 and the identification part 60 may be provided, so that the device constitution can further be miniaturized.

(Modification)

It is to be noted that the present invention is not limited to each embodiment described above. The constitution of a memory cell for use in a storage part is not necessarily limited to a double-layer gate constitution having a floating gate and a control gate, and MONOS may be used in which a charge is accumulated in a trap film formed of an insulating film such as a silicon nitride film. In short, there is no special restriction on a nonvolatile semiconductor memory cell as long as the cell has a charge storage layer and the coupling weight of a neuron model can be stored in accordance with the amount of a charge to be accumulated in the charge storage layer. Moreover, the authentication data is not limited to a fingerprint, a facial image or the like, and any information may be used as long as individuals can be specified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
    a storage part including a plurality of nonvolatile semiconductor memory cells each having a conductive path, a charge storage layer and a control gate electrode;
    a plurality of first input terminals, each connected to one end of the conductive path of each nonvolatile semiconductor memory cell;
    a plurality of second input terminals, each connected to the control gate of each nonvolatile semiconductor memory cell; and
    an output end connected to the other ends of the conductive paths of the nonvolatile semiconductor memory cells, respectively.

2. The semiconductor storage device according to claim 1, further comprising:
    an addition/nonlinear processing part into which a first signal is input from the output end and which outputs a second signal indicating "1" in a case where an added voltage is larger than a predetermined voltage and indicating "0" in a case where the added voltage is the predetermined voltage or less; and
    an identification part which has reference data and which compares the reference data with the second signal output as authentication data for identification.

3. The semiconductor storage device according to claim 1, wherein image data are input into the first input terminals, and cipher data are input into the second input terminals.

4. The semiconductor storage device according to claim 1, wherein a coupling weight of a neuron model is stored in each of the nonvolatile semiconductor memory cells in accordance with an amount of a charge to be accumulated in the charge storage layer.

5. The semiconductor storage device according to claim 1, wherein synapse coupling of a neuron model is output to the output end.

6. The semiconductor storage device according to claim 1, wherein the addition/nonlinear processing part includes an inverter circuit.

7. A semiconductor storage device comprising:
a plurality of bit lines arranged in parallel with one another;
a plurality of word lines crossing the plurality of bit lines and arranged in parallel with one another;
a first input portion which supplies first input data to the plurality of bit lines;
a second input portion which supplies second input data to the plurality of word lines;
a storage part including a plurality of nonvolatile semiconductor memory cells arranged in intersecting portions between the word lines and the bit lines, each of the nonvolatile semiconductor memory cells having a conductive path, a charge storage layer and a control gate connected to corresponding one of the word lines, one end of the conductive path being connected to corresponding one of the bit lines, the other end of the conductive path being connected to a common output end of the storage part;
a plurality of addition/nonlinear processing parts, each being connected to the other end of the conductive path and being configured to add signals output from the nonvolatile semiconductor memory cells each through the conductive path to output a first signal and being configured to output a second signal of "1" in a case where a voltage of the first signal is larger than a predetermined voltage and to output a second signal of "0" in a case where the voltage of the first signal is the predetermined voltage or less; and
a plurality of identification parts, each having reference data and being configured to compare and identify the reference data with the second signal output as authentication data and output a third signal.

8. The semiconductor storage device according to claim 7, wherein image data are input into the first input portion, and cipher data are input into the second input portion.

9. The semiconductor storage device according to claim 7, wherein a coupling weight of a neuron model is stored in each of the nonvolatile semiconductor memory cells in accordance with an amount of a charge to be accumulated in the charge storage layer.

10. The semiconductor storage device according to claim 9, further comprising a controller to which output ends of the identification parts, the first input portion and the second input portion are connected, each output end of the identification parts outputting the third signal,
wherein each of the identification parts includes a reference data memory which stores the reference data, and a comparator which compares and identifies the reference data with the second signal obtained from corresponding one of the addition/nonlinear processing parts,
the controller supplies, during the registration of the reference data into the reference data memory, a random number as a cipher key to be input into each of the word lines successively, changes the value of the random number to change the coupling weight to be stored in each of the memory cells, supplies standard image data as data to be input into the bit lines every time the value of the random number is changed, compares and identifies the reference data with the second signal output as the authentication data, and sets the coupling weight of each of the memory cells in accordance with the value of the random number at a time when a difference between the reference data and the authentication data falls within an allowable range, and
the controller supplies, during data authentication, image data to be verified as data to be input into the bit lines.

11. The semiconductor storage device according to claim 7, wherein synapse coupling of a neuron model is output to the common output end of the storage part.

12. The semiconductor storage device according to claim 7, wherein each of the addition/nonlinear processing parts includes an inverter circuit.

13. A semiconductor storage device comprising:
a plurality of bit lines arranged in parallel with one another;
a plurality of word lines crossing the bit lines and arranged in parallel with one another;
a first input portion which supplies first input data to the plurality of bit lines;
a second input portion which supplies second input data to the plurality of word lines;
a storage part including a plurality of nonvolatile semiconductor memory cells, each having a conductive path, a charge storage layer and a control gate, the storage part including n rows of serially connected units arranged in parallel, each of the serially connected units having m serially connected conductive paths, each of which is the conductive path, one end of the serially connected units being connected to corresponding one of the bit lines, the other end of the serially connected units being connected to the common output end of the bit lines, the control gate of an i-th (i=1 to m) memory cell of the memory cells in the serially connected units being connected to an i-th word line of the word lines;
an addition/nonlinear processing part which adds signals output from the common output end for the same word line to make a first signal and which outputs a second signal in a case where the voltage of the first signal is larger than a predetermined voltage; and
an identification part which has reference data and which compares and identifies the reference data with the second signal output as authentication data and output a third signal.

14. The semiconductor storage device according to claim 13, wherein image data are input into the first input portion, and cipher data are input into the second input portion.

15. The semiconductor storage device according to claim 13, wherein a coupling weight of a neuron model is stored in each of the nonvolatile semiconductor memory cells in accordance with an amount of a charge to be accumulated in the charge storage layer.

16. The semiconductor storage device according to claim 15, further comprising a controller connected to an output end, which outputs the third signal, of the addition/linear processing part, the first input portion and the second input portion,
wherein the identification part includes a reference data memory which stores the reference data, and a comparator which compares and identifies the reference data with the second signal as the authentication data,
the controller supplies, during the registration of the reference data into the reference data memory, a random number as a cipher key to be input into each of the word lines, successively changes a value of the random number to change the coupling weight to be stored in each of the memory cells, supplies standard image data as data to be input into each of the bit lines every time the value of the random number is changed, compares and identifies the reference data with the second signal output from the addition/nonlinear processing part, and sets the coupling weight of each of the memory cells in accordance with the value of the random number at a time when a difference between the reference data and the authentication data falls within an allowable range, and the controller supplies, during data authentication, image data to be verified as data to be input into each of the bit lines.

17. The semiconductor storage device according to claim 15, wherein the addition/nonlinear processing part integrates, with respect to the plurality of bit lines, output currents as the products of threshold voltages as the coupling weights of the cells selected by the word lines and the first input data from the bit lines, and performs nonlinear processing to output a signal indicating "0" or "1".

18. The semiconductor storage device according to claim 13, wherein synapse coupling of a neuron model is output to the output terminal.

19. The semiconductor storage device according to claim 13, wherein the addition/nonlinear processing part includes an inverter circuit.

* * * * *